United States Patent [19]
Armezzani et al.

[11] Patent Number: 5,818,697
[45] Date of Patent: Oct. 6, 1998

[54] FLEXIBLE THIN FILM BALL GRID ARRAY CONTAINING SOLDER MASK

[75] Inventors: Gregg Joseph Armezzani, Endwell; Robert Nicholas Ives, Guilford; Mark Vincent Pierson, Binghamton; Terry Alan Tull, Whitney Point, all of N.Y.

[73] Assignee: International Business Machines Corporation, Armonk, N.Y.

[21] Appl. No.: 828,205

[22] Filed: Mar. 21, 1997

[51] Int. Cl.⁶ ...................................................... H05K 1/14
[52] U.S. Cl. ........................... 361/749; 361/750; 361/751; 361/767; 361/779; 257/737; 257/738; 257/700; 257/774; 257/778; 257/779; 439/66; 439/83; 174/254; 174/255
[58] Field of Search ..................................... 361/749, 750, 361/751, 767, 774, 779, 769; 257/738, 780, 700, 737, 774, 723, 778, 779; 228/180.22; 439/66, 83; 174/254, 255, 258

[56] References Cited

U.S. PATENT DOCUMENTS

| | | | |
|---|---|---|---|
| 4,480,288 | 10/1984 | Gazdik et al. | 361/751 |
| 4,615,781 | 10/1986 | Boudreau | 204/192.15 |
| 4,965,700 | 10/1990 | McBride | 361/751 |
| 5,057,969 | 10/1991 | Ameen et al. | 361/386 |
| 5,203,075 | 4/1993 | Angulas et al. | 29/830 |
| 5,252,846 | 10/1993 | Tanaka et al. | 257/317 |
| 5,286,991 | 2/1994 | Hui et al. | 257/306 |
| 5,368,884 | 11/1994 | Yamagami et al. | 427/96 |
| 5,498,890 | 3/1996 | Kim et al. | 257/310 |
| 5,585,162 | 12/1996 | Schueller | 428/131 |
| 5,676,301 | 10/1997 | Hernandez et al. | 228/44.7 |

FOREIGN PATENT DOCUMENTS

| | | | |
|---|---|---|---|
| 7-297560 | 11/1995 | Japan | H05K 3/46 |
| 8-192482 | 7/1996 | Japan | B32B 3/10 |

*Primary Examiner*—Leo P. Picard
*Assistant Examiner*—David Foster
*Attorney, Agent, or Firm*—Pollock, Vande Sande & Priddy; Lawrence R. Fraley

[57] ABSTRACT

An electronic package is provided that includes a flexible polyimide film carrier having electronic circuitry on both of its major surfaces and a plurality of solder interconnection pads on a first major surface; solder mask layers located on both major surfaces, provided that areas between subsequently to be applied individual circuit chips on the first major surface exist that are free from the solder mask; and a plurality of modules attached to the film carrier by the solder balls or bumps. Also provided is a method for fabricating the electronic package that includes reflow of the solder balls or bumps to achieve attachment of the modules.

10 Claims, 2 Drawing Sheets

FLEXIBLE THIN FILM BALL GRID ARRAY CONTAINING SOLDER MASK

TECHNICAL FIELD

The present invention is concerned with an electronic package and particularly concerned with a thin ball grid array flexible panel, and method for its fabrication. More particularly, the present invention is concerned with a TBGA flexible panel that includes a solder mask and overcomes problem of distorting the flexible film carrier.

BACKGROUND ART

Electronic packages that include a thin film circuit member as an integral part thereof are known in the industry, with examples being defined in U.S. Pat. Nos. 4,849,856 to Funari et al., and 4,914,551 to Anschel et al., both of which are assigned to the same assignee as the present invention. In these electronic package structures, solder bonds are commonly used. In one technique, an electronic device or module (semiconductor chip) is mounted onto a packaging thin film structure in a "flip-chip" orientation. In this orientation, the surface of the chip having contact locations is placed facing the thin films circuit member. The contact locations on the chip and the respective thin film conductive elements are electrically connected using solder structures, also referred to as controlled collapse chip connections (C4's). Polyimides are frequently used as the flexible thin film structure with metal layers being vacuumed deposited, laminated, or glued thereon.

Employing a C-4 type connection to attach a semiconductor device to an organic flexible substrate presents fabrication problems. In particular, because of the flexible nature of the organic substrates, they tend to warp or bend during processing and temperature fluctuations. In addition, in an effort to significantly reduce the cost of individual modules on a carrier, it has been suggested to subject all of the solder balls to reflow on mass rather than individual solder ball connections. Because solderable materials exist extremely close to each pad, a solder mask must be employed to maintain the solder at each pad. Although using a solder mask overcomes this problem it has created another problem. In particular, placing the solder mask on the flexible film carrier causes the flexible flimsy film carrier panel to badly distort. However, it is necessary that the flexible film carrier be reasonably flat or planar to properly carry out the mask reflow technique. Accordingly, it would be desirable to be able to employ a solder mask without the concomitant problem of distorting the flexible film carrier associated with using the solder mask.

SUMMARY OF INVENTION

The present invention makes it possible to use a mask reflow technique employing a solder mask, while at the same time significantly reducing, if not entirely eliminating the problem of distortion.

More particularly, the present invention is concerned with an electronic package that comprises a flexible film carrier having electronic circuitry on both of its major surfaces and a plurality of solder interconnection pads on a first major surface. The electronic package further includes a plurality of modules located on the first major surface of the flexible film carrier and are attached to the carrier by solder balls interconnected to the solder interconnection pads. The solder mask layer is located on both major surfaces of the flexible film carrier; provided that areas between subsequently to be applied individual modules on the first major surface are free from solder mask material.

The present invention is also related to a method for fabricating the above disclosed electronic package. The method includes providing a flexible film carrier having electronic circuitry on both major surfaces thereof and a plurality of solder interconnection pads on a first major surface thereof. A solder mask layer is provided on both major surfaces of the flexible film carrier, whereby there exist areas between subsequently to be applied adjacent individual modules on the first major surface that are free from the solder mask. Modules having solder balls are located on the film corner with the solder balls being mated to corresponding solder interconnection pads. The solder balls are then subjected to reflow in order to bond the chips to the flexible film carrier. The absence of solder mask material in areas between adjacent individual modules significantly reduce the stress thereby reducing the distortion. The areas free from the solder mask material act as hinges relative to the stiff, slightly distorted portions that are not relieved. In addition, the presence of the solder mask on the second major surface of the flexible film carrier helps to strengthen the solder joint.

Still other objects and advantages of the present invention will become readily apparent to those skilled in the art from the following detailed description, wherein it is shown and described only the preferred embodiments of the invention, simply by way of illustration of the best mode contemplated of carrying out the invention. As will be realized, the invention is capable of other indifferent embodiments, and its several details are capable of modifications in various obvious respects, without departing from the invention. Accordingly, the drawings and description are to be regarded as illustrative in nature and not as restrictive.

BEST AND VARIOUS MODES FOR CARRYING OUT INVENTION

Figure 1:
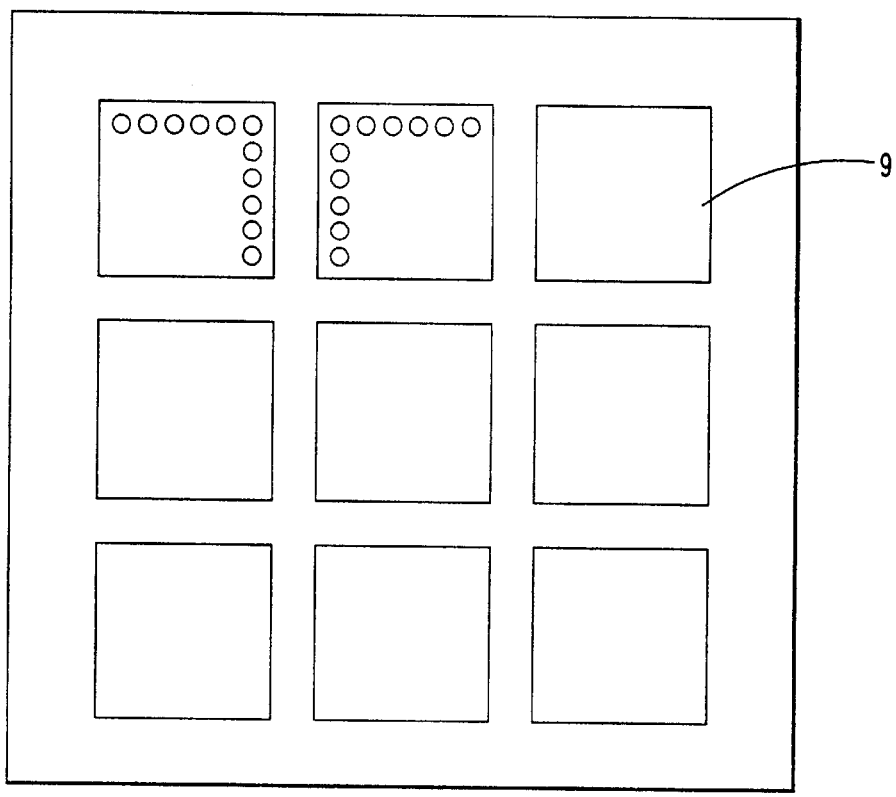
FIG. 1 is a schematic diagram of a bottom view of a flexible film carrier having modules thereon pursuant to the present invention.
Figure 2:
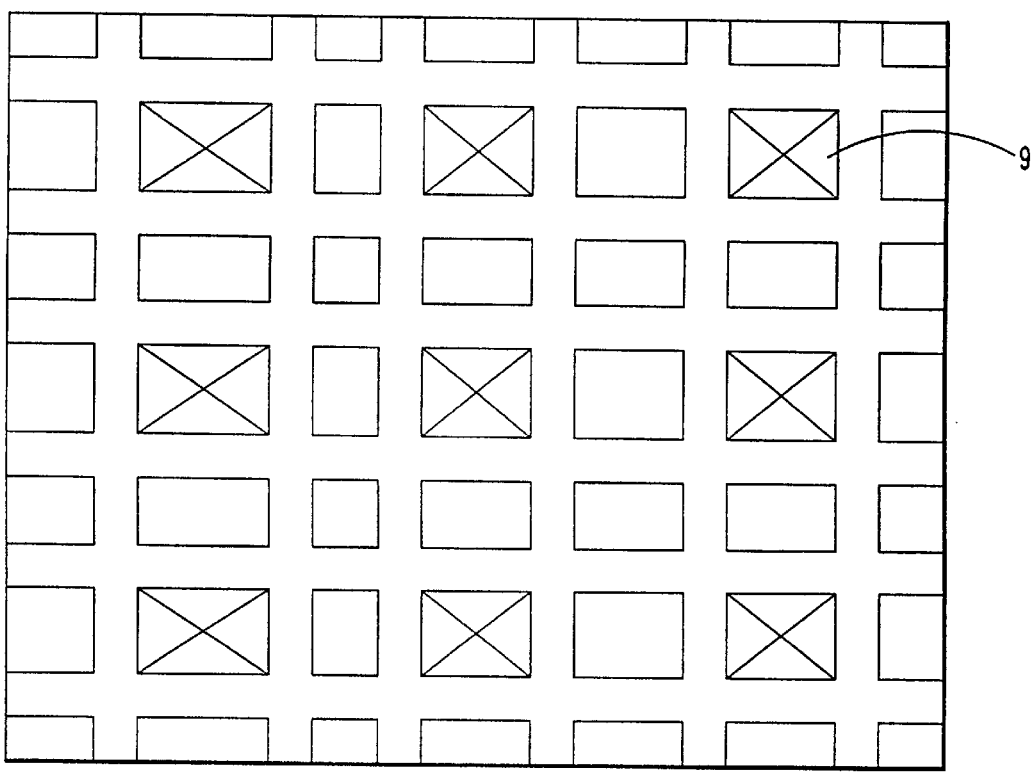
FIG. 2 is a schematic diagram of a top view of a flexible film carrier having modules thereon pursuant to the present invention.
Figure 3:
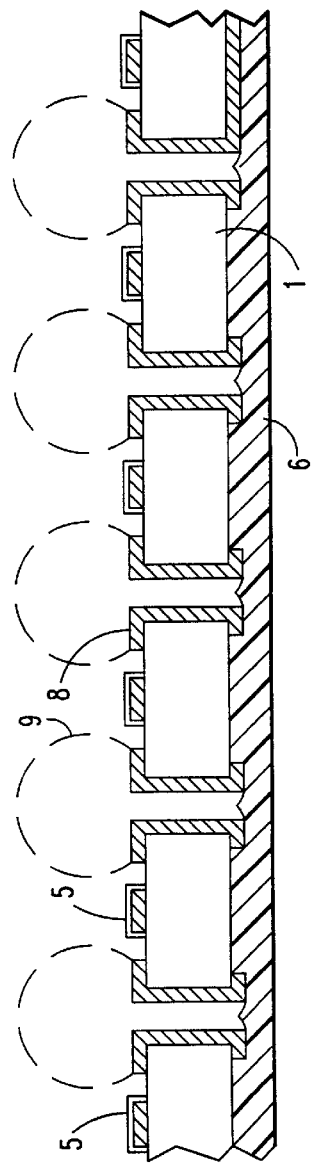
FIG. 3 is a cross-sectional view of a module used in the electronic package of the present invention.
Figure 4:
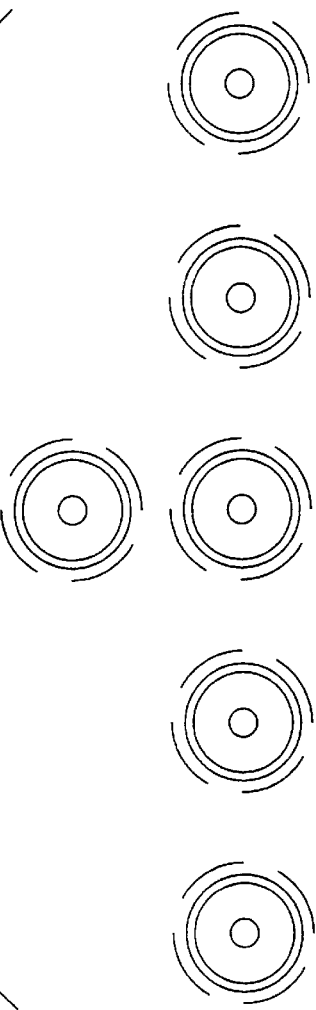
FIG. 4 is a top view of the cross-sectional view of FIG. 3.

In order to facilitate an understanding of the present invention, reference will be made to the figures. The electronic package of the present invention includes a flexible film carrier 1 having electronic circuitry 7 on both major surfaces thereof (see FIG. 3). The flexible film carrier is a dielectric material and can be a thermal plastic or thermosetting organic resin.

Typical organic materials include conventional FR-4 epoxy and laminates based on high temperature resins such as high temperature epoxies, polyimides, cyanates (triazines), fluoropolymers, benzocyclobutenes, polyphenylene sulfides, polysulfones. polyetherimides, polyetherketones, polyphenylquinoxalines, polybenzoxazoles, and polyphenyl benzobisthiazoles.

The preferred materials include the polyimides which can be unmodified polyimides, as well as modified polyimides, such as polyester imides, polyamide-imide-esters, polyamide-imides, polysiloxane-imides, as well as other mixed polyimides. Such are well-known in the prior art and need not be described in any great detail.

Generally, the polyimides include the following recurring unit:

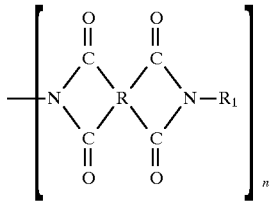

where n is an integer representing the number of repeating units to provide a molecular weight usually about 10,000 to 100,000. R is at least one tetravalent organic radical selected from the group consisting of:

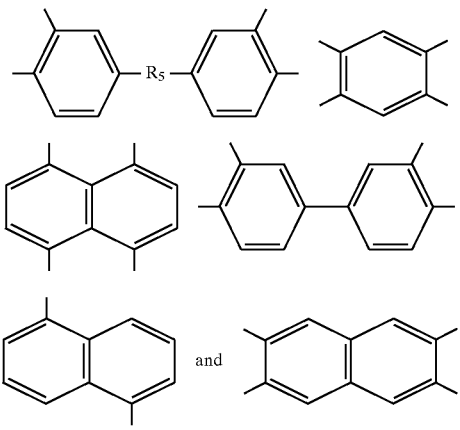

$R_5$ being selected from the group consisting of divalent aliphatic hydrocarbon radicals having from 1 to 4 carbon atoms and carbonyl, oxy, sulfo, hexafluoroisopropylidene and sulfonyl radicals and in which $R_4$ is at least one divalent radical selected from the group consisting of:

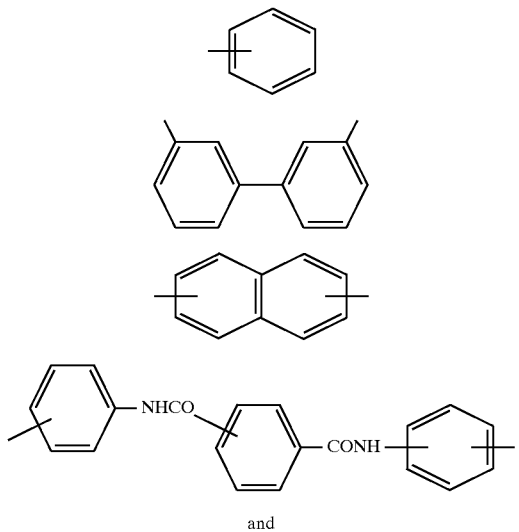

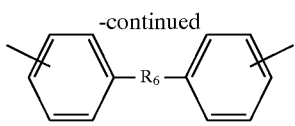

in which $R_6$ is a divalent organic radical selected from the group consisting of $R_2$, silicon, and amino radicals. Polymers containing two or more of the R and/or $R_1$ radicals, especially multiple series of $R_1$ containing amido radicals, can be used.

Commercially available polyimide precursors (polyamic acid) are various polyimide precursors from DuPont and available under the trade designation Pyralin. These polyimide precursors come in many grades, including those available Pyralin polyimide precursors from DuPont under the further trade designations PI-2555, PI-2545, PI-2560, PI-5878, PIH-61454, and PI-2540. Some of these are Pyromellitic Dianhydride-Oxydianiline (PMDA-ODA) polyimide precursors.

Commercially available chemically cured polyimides are various polyimides from DuPont and available under the trade designation Kapton, including H-Kapton, V-Kapton, HN-Kapton, and VN-Kapton, which are all chemically cured polyimides. The chemically cured polyimides are generally cured with an anhydride curing agent, such as acetic anhydride. Also, commercially available are Upilex polyimides from Ube Industries.

The preferred thin film flexible carrier is a polyimide. The thin film carrier is typically about 2 to about 10 mils, and preferably about 1 to about 3 mils thick.

A plurality of solder interconnection pads 8 are provided on a first major surface of the flexible film carrier 1. Typical solder interconnection pads 8 are copper or a solderable material. Also located on the solder pads is a relatively high viscosity, low solids solder flux material for cleaning the solder pads and for maintaining the solder ball in position during the reflow technique. Typical solder flux compositions are those based upon rosin. The primary active oxide-reduction constituent of a rosin flux is abietic acid. Examples of some rosin flux composition can be found in U.S. Pat. Nos. 2.715,084; 3,478,414; 4,168,996; 3,730,782; and 4,441,938, disclosures of which are incorporated herein by reference. A typical flux composition employed in the present invention is Quadrol Polyol, which is a propoxylated amine and particularly, tetrahydroxypropylethylenediamine. Another typical flux is Kester R-244C which is a no clean flux containing a modified rosin, diethylene glycol butyl ether, petroleum distillate and an organic thickener. The flux employed desirably is in paste or cream form and formulated for low melt eutectic solders. The paste can be used to attach a solder ball or form the ball itself.

Located on the first major surface of the flexible film carrier is solder mask material 5 and located on the second major surface of the flexible film carrier, is solder mask layer 6. As illustrated, areas between subsequently to be applied adjacent individual modules on the first major surface exist that are free from the solder mask 5. This results in reducing distortion in all three X, Y and Z direction by relieving the panel in those areas that are free from the solder mask. The relief areas act as hinges relative to the stiffer, distorted sections of the flexible film carrier that are not relieved. However, these areas render the flexible film carrier sufficient planar so as to be subsequently processed with the flux and solder ball preforms. The areas that are free from solder material can be merely slits in the material achieved by etching, for instance, and need only be about ⅛ inch wide, and should be spaced no more than about 0.1 inch apart. In a preferred aspect of the present invention, substantially all of the area between the subsequently to be applied adjacent integrated circuit chips is free from the solder mask material.

Figure 5:
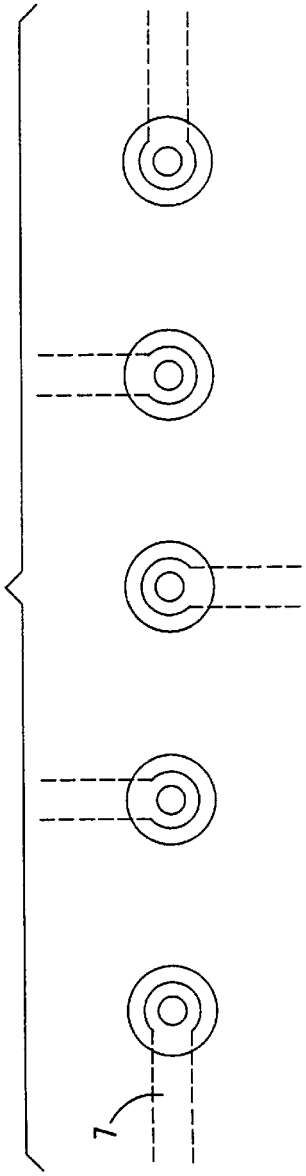
FIG. 5 is a bottom view of the cross-sectional view of FIG. 3.

The solder mask material 6 on the second major surface of the flexible film carrier keeps the subsequently to be applied solder from wicking up the circuit line 7 (see FIG. 5) at the reflow temperatures when the solder ball 9 is forming. In addition, the solder mask material 6 helps to strengthen the solder joint. If desired, there can also exist areas on the second major surface of the flexible film carrier that are free from the solder mask material.

The solder mask material should provide for a permanent solder mask and include photosensitive acrylate and methacrylate type solder mask materials, and epoxy based solder masks. The solder mask material can be liquid or a dry film. When liquid, it can be sprayed or screened onto the carrier. An example of a suitable solder mask is Vacrel 8120 available from DuPont. Vacrel 8120 is a photoimageable dry film of about 2 mils thick and is an acrylate based system from polyol acrylate monomers, benzyphenone, ethyl-4-dimethylamino benzoate, N-methyl-2-pyrrolidone and methylene chloride. Other available suitable solder masks are ASM DF, also known as Laminar L-8404; PSR-4000, ASM UV curing epoxy, Grace CM 2001 (version 3302); and Hysol SR8200. ASM DF is a photoimageable, epoxy based dry film of about 2 mils thick. It contains an epoxy resin; propylene glycol methyl ether acetate; filler and an organic antimony salt. PSR-4000 is a liquid photoimageable solder from an epoxy based system containing diethylene glycol monoethyl acetate. Grace CM 2001 (version 3202) is a liquid acrylic ester system which includes an epoxy resin, ethylene glycol monobutyl ether acetate, an acrylated oligomer, a photoinitiater and curing agent. Hysol SR8200 is a flat matte photoimageable solder mask from an epoxy resin and ethylene glycol monobutyl ether acetate. ASM UV curing epoxy is similar to ASM DF except that it is in liquid form containing more diluent.

It is desirable that the coefficient of thermal expansion of the solder mask material match as close as possible to that of the flexible film carrier, so as to minimize stress on the electronic package, especially during processing. Moreover, solder mask compositions are well known and need not be described in any great detail. Suitable ones can be readily selected by those skilled in the art once aware of the present application.

The solder mask material is typically laminated or blanket coated to both major surfaces of the flexible film carrier. When laminating, for example Vacrel, such is typically laminated under vacuum at temperature of about 90° C., and for a time of about 60 to about 90 seconds. Next, the solder mask material 5 on the first major surface is photodeveloped. In particular, a mask is aligned and then the solder mask material is exposed to actinic light, such as ultraviolet light; x-ray or e-beam, a typical example being collimated UV light at about 150 millijoules at about 40° C. This is followed by development in a solvent such as a 1% aqueous sodium carbonate solution. The sodium carbonate can be applied by spraying pressures of about 50 psi with a throughput of about 171 meters/min. The remaining mask material can be post baked such as at about 150° C. for about 1 hour and subjected to a final cure such as UV light at about 2.5 joules. In the case of a positive photoresist, those portions that are exposed are removed in the development, leaving the portion where the solder pads are present and to provide areas between subsequently to be applied adjacent individual modules that are free from the solder mask material.

Next, individual modules 2 having solder balls 9 are mated to a corresponding solder pad 8 on the first major surface of the flexible film carrier. The solder ball is preferably made from a relatively low melting point solder, such as solder eutectic of 63 Sn 37 Pb, 60 Sn 40 Pb, or the low melting point solder materials disclosed in U.S. Pat. No. 5,553,769, disclosure of which is incorporated herein by reference. Typically, such having a melting point from about 110° to about 120° F. and contain about 44.5 to 44.7% bismuth, about 22.5 to 22.7% lead, about 8.0 to about 8.3% tin, about 5.0 to about 5.3% cadmium, and about 17.5 to 18.1% indium. The solder balls are made of a relatively low melting material in order to facilitate the reflow process.

After the modules are properly aligned, the assembly is subjected to a solder reflow technique, whereby the assembly is heated to a temperature of about 200° C. to about 230° C., typically about 220° C. for about 3 minutes in order to reflow the solder balls for interconnection to the solder pads on the flexible film carrier.

In this disclosure, there are shown and described only the preferred embodiments of the present invention, but as aforementioned, it is to be understood that the invention is capable of use in various other combinations and environments, and is capable of changes or modifications within the scope of the inventive concept as expressed herein.

What is claimed is:

1. An electronic package comprising a flexible film carrier having electronic circuitry on both major surfaces thereof, and a plurality of solder interconnection pads on a first major surface thereof; solder mask layer located on both major surfaces of said flexible film carrier; a plurality of modules located on said first major surface of said flexible film carrier and attached to said flexible film carrier by solder balls mated to solder interconnection pads on said first major surface; and wherein said solder mask is not present on areas of said first major surface located between adjacent modules.

2. The electronic package of claim 1 wherein said flexible film carrier is a polyimide.

3. The electronic package of claim 1 wherein said solder mask layers on both of the major surfaces is the same material.

4. The electronic package of claim 1 wherein said solder mask layers are permanent solder mask materials.

5. The electronic package of claim 1 wherein said solder mask material is an epoxy, acrylate or methacrylate based material.

6. The electronic package of claim 1 wherein said solder mask on said first major surface of said flexible film carrier contains slits at least ⅛ inch wide.

7. The electronic package of claim 1 wherein said substantially all of the areas between adjacent individual modules are free from said solder mask.

8. The electronic package of claim 1 wherein the solder balls are eutectic tin/lead.

9. The electronic package of claim 1 wherein on said second major surface there exists areas free from said solder mask between modules.

10. The electronic package of claim 1 wherein said flexible film carrier is a flexible organic film carrier.

* * * * *